United States Patent

Nakata

[11] Patent Number: 5,817,173
[45] Date of Patent: Oct. 6, 1998

[54] METHOD FOR MAKING SPHERICAL CRYSTALS

[76] Inventor: Josuke Nakata, 112-17, Kamiootani Kuse, Jyoyo-shi, Kyoto 610-01, Japan

[21] Appl. No.: 656,327
[22] PCT Filed: Aug. 7, 1995
[86] PCT No.: PCT/JP95/01595
  § 371 Date: Jun. 11, 1996
  § 102(e) Date: Jun. 11, 1996
[87] PCT Pub. No.: WO96/15298
  PCT Pub. Date: May 23, 1996

[30] Foreign Application Priority Data

Nov. 10, 1994 [JP] Japan .................................. 6-302799

[51] Int. Cl.[6] ................................................ C30B 29/62
[52] U.S. Cl. ................................................ 117/73; 117/87
[58] Field of Search ........................ 117/75, 87, 921, 117/922

[56] References Cited

U.S. PATENT DOCUMENTS

| | | | |
|---|---|---|---|
| 4,099,986 | 7/1978 | Diepers | 117/75 |
| 5,336,360 | 8/1994 | Nordine | 117/75 |
| 5,431,127 | 7/1995 | Stevens et al. | 117/75 |
| 5,544,617 | 8/1996 | Terui et al. | 117/75 |
| 5,650,007 | 7/1997 | Kawakami et al. | 117/75 |

*Primary Examiner*—Felisa Garrett
*Attorney, Agent, or Firm*—Morrison Law Firm

[57] ABSTRACT

The present invention relates to a method for forming crystal substrates on which can be easily formed spherical crystals which have superior crystal structure and little defect in shape. The present invention also relates to a method for making crystal substrates on which can be easily formed spherical crystals which have little defect in shape and from which impurities have been removed. Projections are formed integrally from a semiconductor crystal base, and flow regulating film is formed to cover the entire outer surface of the crystal base and a base portion of the projections. A heating beam is applied to the tips of the projections, and the end portions of the projections are melted. The surface tension of the melt and the melt regulation by the flow regulating film act to solidify the melt in a spherical shape, thus forming a spherical crystal.

15 Claims, 14 Drawing Sheets

METHOD FOR MAKING SPHERICAL CRYSTALS

BACKGROUND OF THE INVENTION

The present invention relates to a method for making spherical crystals. In particular, the present invention relates to a method for making spherical crystals for use in semiconductors, dielectrics, magnetic bodies, and superconductors.

Spherical crystals can be made by growing crystals in a spherical form using the surface tension of a melt. Because of the symmetry in the outer shape due to the spherical structure, these spherical crystals allow easy creation of single crystals which have few defects and no disorder in atomic arrangement inside the crystals. In particular, an environment affected minimally by gravity will permit single crystals that are determined by the surface tension of the melt and are more spherical. Furthermore, since buoyancy does not affect the process, there is no thermal convection due to temperature differences, thus preventing disturbances. In cases where two or more elements are used to grow a crystal, segregation due to different specific gravities in the elements are avoided. Thus, it is possible to make spherical single crystals that have uniform composition and good crystallinity. These types of high-quality spherical crystals have many possibilities in industrial fields that use crystals. These spherical crystals can be used directly in applications such as electronic devices, optical elements, and functional elements.

Conventionally, single crystals for semiconductors and the like have been formed in the shape of rods, plates and films. Thus, the crystals have not been grown as spheres from the start. In particular, there have been no proposals at all for technologies that allow localized growth of spherical crystals on plate-shaped or rod-shaped crystal bases.

There have been three types of technology to grow single crystals for semiconductors: the method of using a melt to grow crystals; the method of growing crystals from a solute using a solvent; and the method of growing crystals through chemical deposition from the gas phase.

Generally, in the method of using a melt to grow crystals, the entire material is stored in a container such as a crucible or an ampoule. The material is heated and melted in an electric furnace that uses high-frequency heating or resistance heating. A seed crystal is put in contact with the melt, and it is pulled up while being rotated (the CZ method).

In the floating zone method (FZ method), a crucible is not used. This method is another popular method for growing single crystals. In this method for growing crystals, the melt forms melt zones between a rod-shaped seed crystal and a polycrystal. The melt is supported by surface tension while moving toward the polycrystals and are transformed into single crystals. However, forming stable floating zones in this method requires high surface tension and the use of material with low density.

In another method for growing single crystals, an electric furnace is not used, and instead a laser beam is used as a heat source. A material with a high melting point such as Spinel ($MgAl_2O_4$) is melted, and the resulting melt is used to grow single crystals. Film crystals are obtained by melting amorphous silicon films on a silicon wafer. These techniques are well known. However, there is still no known method to directly create spherical single crystals by using heating beams such as laser beams to melt materials such as semiconductors, dielectrics, magnetic bodies, superconductors or metals.

There have been attempts made to grow semiconductor crystals and certain alloy crystals in microgravity environments. It has also been known that in microgravity conditions, melts have accidentally leaked to form spherical crystals. However, there have been no proposals for methods to intentionally grow spherical crystals. Furthermore, the idea of making spherical crystals by growing crystals spherically from a melt has not been proposed at all. The inventor of the present invention is focussing on the various possibilities for applying spherical crystals to electronic devices and optical elements. However, the making of spherical crystals using the conventional technology requires mechanical polishing of the crystal body, chemical etching and the like.

In the method for growing crystals by placing material in a container such as a crucible, melting it, and solidifying it, it is possible for the molten material and the material of the container to react. This causes impurities from the container to dissolve and makes it difficult to grow high-quality crystals. Furthermore, when the material solidifies inside the container, it was possible for heterogeneous nuclei to be created due to contact with the container wall, and there could be internal warping within the crystals due to uneven cooling conditions. Thus, it was extremely difficult to grow crystals without defects. Furthermore, according to this conventional method, the objective is to perform bulk production by placing the material in the container, melting it and solidifying it. Therefore it is impossible to freely grow spherical single crystals at a prescribed position at a restricted size or amount. For example, it would be completely impossible to grow spherical crystals for electronic devices or optical elements on a section of a crystal base. In the conventional method for forming single crystals by melting material in bulk and solidifying from one end of a seed crystal, the resulting crystals would be rod-shaped or plate-shaped. These shapes do not have three-dimensional symmetry as spheres do, and so they tended to result in defects due to factors such as disorder in the atomic configuration within the crystals, or thermal warping.

It may be possible to grow spherical single crystals by melting and solidifying the material in zero-gravity or microgravity. However, the heating, melting and solidifying takes a long time in the conventional method because heating methods such as electric furnaces and infrared lamps are used. These could not be used in the drop-shaft type or the drop tower type facilities for microgravity experiment, which would require crystals to be grown within a very short time span of 10 seconds or less. This would restrict this method to microgravity in space, which would make the growth of spherical crystals extremely costly.

The present applicant has conducted various experiments to establish a method for making spherical crystals. In a past application, Japanese patent application 5-284499, the present applicant proposed such a method for making spherical crystals. Referring to FIG. 24(a), a thin projection 101 comprising a crystal made from a metal or a metal oxide or a non-metallic material. Projection 101 is disposed so that it projects from the surface of a crystal base 100, comprising a metal or a metal oxide or a non-metallic material. Referring to FIG. 24(b) and FIG. 24(c), at least a portion of projection 101 is heated with a heating beam 102, so that surface tension causes a spherical crystal to solidify.

Referring to FIG. 24(c), because projection 101 and melt 103 are made from the same material and thus have high wettability, melt 103 flows along the surface of the unmelted portion of projection 101a. Melt 103 solidifies in a thin and elongated shape, and does not result in a spherical shape.

Thus, it became clear that a spherical crystal having a roughly spherical shape could not be formed. In particular, the specific gravity of the melt (volume x density x acceleration of gravity) is large, facilitating the Marangoni effect, tending to cause the crystal structure to fall apart.

If a laser beam is used as the heating means, the cooling due to heat conduction is quick, allowing solidification in a short time. This minimizes the collapse of the spherical shape. If an infra-red beam is used for heating, the radiation energy density will be relatively low and the rate of temperature increase will be slow. This increases the tendency of the melt to flow along the unmelted portion of the projection, thus facilitating the collapse of the crystal shape.

When the above crystal structure solidifies, solidification (crystallization) begins from the unmelted portion of the projection. If the crystal used in the projection is an inexpensive crystal that does not have a high degree of purity, the impurities in the crystal would accumulate at the surface of the spherical crystal. Thus, it would be difficult to form a spherical crystal having a high degree of purity.

OBJECTS AND SUMMARY OF THE INVENTION

The object of the present invention is to provide a method for easily forming a spherical crystal on a crystal base that has a superior crystal structure without any collapse of shape and that has no internal stress or crystal defects. A further object of the present invention is to provide a method for easily forming a high quality spherical crystal on a crystal base without any collapse of shape and that has few impurities and defects within the crystal.

The present invention (claim 1) is a method for making spherical crystals and includes: a first process wherein a thin projection comprising a crystal made from metal or a metal oxide or a non-metallic material is disposed so that it projects from a surface of a crystal base comprising a metal, a metal oxide or a non-metallic material; a second process wherein a flow regulating film having a higher melting point than the crystal making up the projection is formed over an entire outer surface of a base portion of the projection, away from a tip of the projection; a third process wherein a heating beam is applied to the tip of the projection to melt the portion of the projection more toward the tip than the flow regulating film; a fourth process wherein the application of the heating beam to the projection is stopped and a spherical crystal having a roughly spherical shape is solidified through the surface tension of the molten portion and the flow regulating action of the flow regulating film. In this invention, the projection can be made from the same crystal as the crystal base and formed integrally with the crystal base, or a projection made from a crystal identical to or different from the crystal base can be fixed to the surface of the crystal base.

In the first process, it would also be possible to have a thin projection formed so that it projects integrally from a semiconductor crystal base (claim 2). It would also be possible to dispose a thin projection comprising a semiconductor crystal so that it projects from the surface of a semiconductor crystal base (claim 3).

Referring to FIG. 1(a) and FIG. 2(a), the present invention involves disposing a thin projection 11 comprising a crystal made from a metal or a metal oxide or non-metallic material so that it projects from the surface of a crystal base 10 comprising a metal or a metal oxide or a non-metallic material. Referring to FIG. 1(b) and FIG. 2(b), a flow regulating film 12 is formed over the entire outer surface of a base portion 11 of projection 11, located from the tip. Referring to FIG. 1(c) and FIG. 2(c), a heating beam 13 is applied to the tip of projection 11 so that the portion of projection 11 past flow regulating film 12 is melted. Referring to FIG. 1(d) and FIG. 2(d), the application of heating beam 13 on projection 11 is halted, and a molten portion 11b is solidified into a spherical crystal 14 that is roughly spherical in shape through the effect of surface tension and through the flow regulating operation of flow regulating film 12.

For the metallic material described above, single metals or various types of alloy metals can be used. In particular, various types of semiconductors, dielectrics, magnetic material, superconductors and the like can be used.

The projection described above, comprising crystals made from metals or metal oxides or non-metallic material, is made up of single crystals or polycrystals. The heating beam can be a heating beam having a high energy density, such as lasers, condensed infra-red beams, and electron beams.

When a laser is to be used for the heating beam described above, the laser beam can be made to have a high energy density and a very small focus diameter. Thus, a laser beam is particularly suited for melting the projection, which has a very small thickness on the order of between tens of microns and hundreds of microns. By forming multiple rows of projections and scanning a laser beam over the tips of the arranged projections, it is possible to perform the third and fourth processes in a very short period of time. In particular, the method can be used for making spherical crystals in free-falls microgravity experimental facilities or in airplanes flying in a parabolic path. This is extremely useful in reducing the costs involved in microgravity crystal growth.

Also, when a laser is used, there is almost no heating in the areas other than the portion to be melted, making it possible to heat and melt only the intended portions. It is also possible to adjust the amount of heat entry appropriately by adjusting the laser beam output and the scan speed. Heating can also be performed efficiently for specific areas as desired, such as a portion of the projection or the entire projection. When necessary, different elements can be attached to the tip of the projection for doping or for forming mixed crystals. The different element would be melted together with the projection to solidify into a spherical crystal.

The flow regulating film described above is a film having a melting point that is higher than that of the crystal making up the projection. Various types of metal oxides, metal nitride and the like can be used for the film. However, it would be desirable to make the flow regulating film out of a material that has a high melting point and low wettability relative to the material used in the projection, since the film serves to restrict the flow of the molten portion of the projection along the surface of the unmelted portion of the projection. The formation of the flow regulating film can be performed, for example, by using chemical vapor deposition (CVD) or the like to form a film having a high melting point over the entire surface of the crystal base and the projection. Then, etching or the like would be used to eliminate the film for all areas except for the base portion of the projection. Referring to FIG. 1 and FIG. 2, there are shown examples where flow regulating films are also formed over the crystal base, but it is acceptable to omit the flow regulating film for the surface of the crystal base.

Since surface tension and regulation of flow by the flow regulating film are used to solidify a spherical crystal in a roughly spherical shape, it is necessary for the projection to be thin enough that the effects of surface tension are dominant. The thickness of the projection can be, for example, a few mm or less, and can be a few hundred microns in semiconductors and the like. The cross-section shape of the projection is not limited to a circular shape, and can also be rectangular, square or the like. By applying a heating beam for a short period or instantaneously, it is possible to melt the projection at the portion past the flow regulating film.

Due to surface tension in the melt and the flow regulating action by the flow regulating film, the portion that is melted by the heating beam forms a roughly spherical shape without any collapse in shape, and its surface forms a free surface. When the application of the heating beam is halted, the molten portion of the projection forms a spherical crystal by solidifying rapidly while maintaining the spherical shape. The solidification occurs mainly due to the heat absorption into the crystal base via the projection. The crystal grows with a directionality centering on the portion of the seed crystal that is not molten and that is in contact with the melt. Since the nucleus of the crystal growth is at the borderline between solid phase and liquid phase, and since the outward flow of latent heat in solidification occurs rapidly on the seed crystal side, the growth from the seed crystal to the crystal proceeds quickly. Then, as growth proceeds from the seed crystal to the crystal, the crystal growth proceeds at the central portion of the spherical portion before the outer perimeter portion of the spherical portion so that the single crystal grows and solidifies from the center of the sphere toward the outer perimeter. In particular, it is possible to limit the heat dissipation from the outer perimeter of the melt by setting a high atmosphere temperature as appropriate. Because crystal growth proceeds from the center of the sphere outward, and because the temperature gradient in the direction of crystal growth is steep, disturbances in the crystal growth surface due to constitutional supercooling and the like are avoided, and internal stress and crystal defects in the spherical crystal do not tend to occur.

Solidification occurs while a roughly spherical shape is maintained by the surface tension of the molten portion and the melt regulation by the flow regulating film. Because of the symmetry of the sphere surface and the spherical symmetry of the growth of the crystal, the internal structure of the spherical crystal maintains a spherical symmetry as well. There tends to be little disorder in the atomic arrangement, and the surface of the spherical crystal forms a crystal surface having a constant mirror indices. The resulting single crystal is an ideal crystal with almost no defects. In particular, the damage and the strain resulting from mechanical or chemical processing do not occur, and the surface of the spherical crystal forms an ideal spherical mirror. However, if an impurity is contained in the projection, the impurity will be segregated at the surface of the spherical crystal.

As described above, spherical crystals made from single crystals or roughly single crystals can be formed very easily on a crystal base by using a heating beam to melt and then solidifying the melt. In particular, it is possible to form spherical crystals in a manner that is significantly easier and more inexpensive compared to making spherical crystals by mechanically or chemically processing semiconductors.

The surface of the spherical crystal described above forms an ideal spherical mirror, and will not have the defects that tend to occur on the surface of crystals. Furthermore, thermal stress, as occurs in semiconductor wafers, is avoided since the inducement of surface stress due to non-uniform differences in thermal expansion of the oxide film does not tend to occur.

Furthermore, when at least a portion of a projection is to be melted and crystallized, the melt comes into contact with only the crystals of the projection, which serve as the seed crystal, and the flow regulating film. Thus, high-quality spherical crystals are possible, and the problems that occur when crystals are grown while held in a container such as a crucible are avoided. These include: the mixture of outside impurities; pollycrystallization due to thermal convection or irregular growth of nuclei caused by non-uniform heat absorption into the container; and crystal deformations due to thermal stress between the container and the growing crystals. Also, the melt is crystallized while it absorbs heat from the seed crystal. Thus, crystal growth proceeds rapidly while the growth nucleus is restricted by the seed crystal. This makes it difficult for constitutional supercooling to take place, and provides a high-quality spherical crystal. Furthermore, since crystallization is performed while a roughly spherical shape is maintained through surface tension of the melt and flow regulation by the flow regulating film, it is possible to form a spherical crystal having a fixed shape.

On a final note, when a semiconductor single crystal such as silicon is used for the projection, it is possible to form a spherical semiconductor single crystal. The use of a dielectric projection makes it possible to form a dielectric spherical crystal. The use of a magnetic material for the projection makes it possible to form a magnetic spherical crystal. The use of a superconductor projection makes it possible to form a superconductor spherical crystal.

Referring to FIG. 1, when a projection is formed integrally with a semiconductor crystal base, it is possible to form a semiconductor single crystal or roughly single crystal at the tip of the base portion of the projection formed integrally with the semiconductor crystal base. Referring to FIG. 2, it is possible to form a semiconductor single crystal or roughly single crystal spherical crystal in the following manner. A thin projection comprising a semiconductor crystal is adhered or bonded to the surface of a semiconductor crystal base so that it projects. An example of this would be the adhesion of a semiconductor crystal having a prescribed thickness to the entire surface of the crystal base, and then the semiconductor crystal is processed so that a plurality of projections are formed in a matrix formation. The semiconductor crystal base can be a single crystal base or a polycrystal base that is not a single crystal. Because the projection comprises a semiconductor crystal, it is possible to form a semiconductor single crystal or roughly single crystal spherical crystal.

The present invention (claim 4) is a method for making spherical crystals including: a first process wherein a thin projection made from a crystal comprising a metal or a metal oxide or a non-metallic material is disposed so that it projects from the surface of a crystal base comprising a metal or a metal oxide or a non-metal material; a second process wherein a flow regulating film having a melting point higher than that of the crystal used in the projection is formed on the surface of the crystal base from which the projection projects; a third process wherein a heating beam is applied to the tip of the projection and the entire projection is melted; and a fourth process wherein the application of the heating beam to the projection is halted and the molten portion is solidified into a spherical crystal having a roughly spherical shape due to surface tension and flow regulation by the flow regulating film. It would also be possible to form a projection comprising the same crystal as used in the crystal base integrally with the crystal base. Or, it would also be possible to fix a crystal that is the same as or different from the crystal base to the surface of the crystal base.

In the first process, it would also be possible to form a thin projection projecting integrally from the surface of a semiconductor crystal base (claim 5). It would also be possible to dispose a thin projection comprising a semiconductor crystal so that it projects from the surface of a semiconductor crystal base (claim 6).

Referring to FIG. 3(a) and FIG. 4(a), in the present invention a thin projection 21 comprising a metal or a metal oxide or a non-metallic crystal is disposed so that it projects from a surface of a crystal base 20 comprising a metal or a metal oxide or a non-metal material. Referring to FIG. 3(b) and FIG. 4(b), a flow regulating film 22 having a melting point higher than that of the crystal used in projection 21 is formed on the surface of crystal base 20 from which the projection projects.

Referring to FIG. 3(c) and FIG. 4(c), a heating beam 23 is applied to the tip of projection 11, and projection 21 is melted entirely. Referring to FIG. 3(d) and FIG. 4(d), the application of heating beam 23 to projection 21 is halted. A spherical crystal 24 having a roughly spherical shape is solidified from a molten portion 21b described above due to surface tension and flow regulation by flow regulating film 22. In the present invention, it is possible to form spherical crystals similar to the ones described above on the surface of a crystal base.

Referring to FIG. 3, if a thin projection is formed so that it projects integrally from the surface of a semiconductor crystal base, it is possible to form spherical semiconductor single crystals or roughly single crystals on the surface of a semiconductor crystal base. As in the spherical crystals described above, these spherical crystals have almost no internal stress and have an internal structure that is spherically symmetrical. There is no disorder in the atomic arrangement, and the result is an ideal crystal with almost no crystal defects and with a spherical crystal surface having a constant mirror indices.

Referring to FIG. 4, there is shown the example of a thin projection comprising a semiconductor crystal that is adhered or bonded so that it projects from the surface of a semiconductor crystal base. In this case, the semiconductor crystal base can be a single crystal base, or it can be a polycrystal base that is not a single crystal. As described above, since the projection comprises a semiconductor crystal, a semiconductor spherical single crystal or roughly-single crystal can be grown.

It is possible to use a metallurgical-grade semiconductor base that does not have a high degree of purity for the semiconductor crystal base or the projection (claim 7). In this case it is possible to significantly reduce material costs for the crystal base or the projection. However, if the crystal base and the projection are formed integrally, a semiconductor spherical crystal that does not have a high degree of purity will result. But as noted below, it is possible to eliminate impurities within the spherical crystal, so this is not a major obstacle in implementation.

It is possible to use a semiconductor single crystal base as the semiconductor crystal base (claim 8). Integrally forming the projection with the crystal base will result in the crystal used in the projection also being a semiconductor single crystal, thus making it possible to form spherical crystals that are semiconductor single crystals.

It is possible to form spherical crystals comprising semiconductor single crystals by using a semiconductor single crystal in a projection that is not integral with a semiconductor crystal base (claim 9).

In cases where at least the fourth process is performed in zero-gravity or microgravity environments (claim 10), there is little effect from gravity on the molten portion. Surface tension and flow regulation due to the flow regulating film results in the formation of spherical crystals with almost perfectly spherical shapes. Also, since thermal convections due to gravity can be ignored, spherical crystals with improved quality are possible. Furthermore, multiple types of material having different specific gravity can be used to form spherical crystals that are mixed-crystals or compounds. In this case, the differences in specific gravity do not cause separation, sedimentation, or buoyancy, it is possible to grow single crystals with a uniform composition.

When a spherical crystal solidifies, crystal growth occurs from the unmelted crystal (the crystal making up the projection or the crystal making up the crystal base) and solidification occurs from the center of the spherical melt toward the surface. The impurities accumulate on the surface of the spherical crystal due to segregation. After the fourth process, it would be possible to perform a fifth process wherein the surface of the solidified spherical crystal is etched in order to eliminate the impurities accumulated on the surface of the spherical crystal (claim 11).

It would also be possible to repeatedly perform the fifth process, wherein impurities accumulated on the surface of the solidified spherical crystal are eliminated by etching the surface of the spherical crystal, and a sixth process, wherein the spherical crystal for which the impurities were eliminated in the fifth process is then melted again and solidified in a spherical shape, thereby recrystallizing the crystal. By increasing the number of times this is repeated, it is possible to increase the purity of the spherical crystal. Because the spherical crystal can be made more pure in this manner, it is possible to make the projection out of very inexpensive crystals that do not have a high degree of purity. This is especially advantageous when the projection and the crystal base are formed integrally, since a very inexpensive crystal that does not have a high degree of purity can be used for the crystal base.

It is also possible to eliminate the internal stress and lattice defects in the solidified crystal when annealing is performed on the spherical crystal (claim 13). This can improve the properties of the spherical crystal.

It is also possible to form a new oxide film on the surface of the solidified spherical crystal after the old oxide film on the surface of the spherical crystal is eliminated. Then, heat would be applied to the spherical crystal so that impurities within the spherical crystal would be gettered by the oxide film (claim 14). Elements with high coefficients of diffusion (such as Au, Ag, Cu in silicon crystals) have the property of being gettered into the oxide film when heat treatment is applied to accelerate diffusion. Thus, with the methods described above, it is possible to improve the purity of the spherical crystal and improve the electro and optical properties.

It is also possible to form a new oxide film on the surface of the solidified spherical crystal after the old oxide film on the surface of the spherical crystal is eliminated, and then to apply heat to the spherical crystal so that the impurities within the spherical crystal are gettered into the oxide film (claim 15). Because elements having high coefficients of diffusion as described above cannot always be completely eliminated, the elements having high coefficients of diffusion are eliminated in the same manner as described in claim 14. This improves the purity of the spherical crystal.

The above, and other objects, features and advantages of the present invention will become apparent from the following description read in conjunction with the accompa-

DETAILED DESCRIPTION OF THE PREFERRED EMBODIMENTS

Figure 1A:
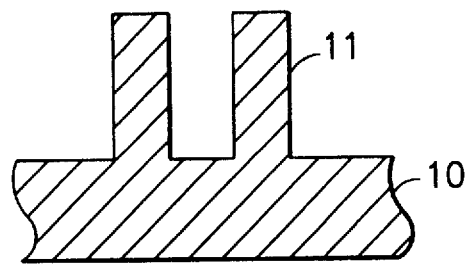
FIGS. 1(a)–(d) are drawings for the purpose of explaining the concepts involved in the four processes used to integrally form a crystal base and a projection and then to form a spherical crystal out of a portion of the projection.
Figure 1B:
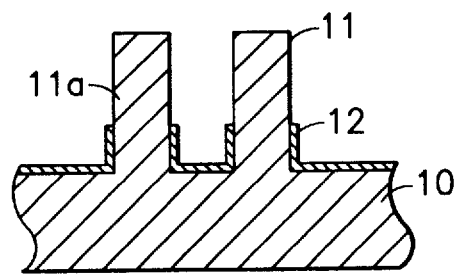
Figure 1C:
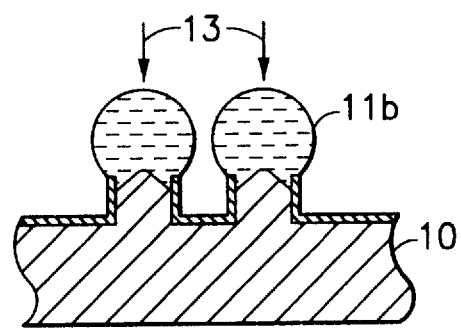
Figure 1D:
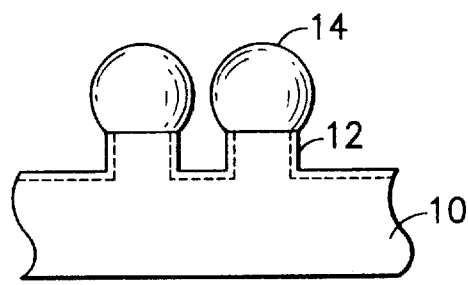
Figure 2A:
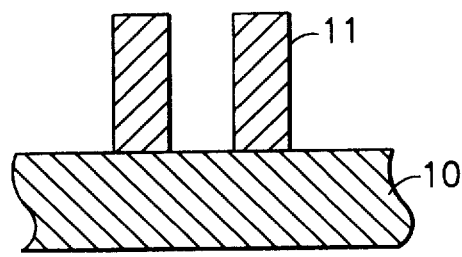
FIGS. 2(a)–(d) are drawings for the purpose of describing the concepts involved in the four processes used to fix a projection to a crystal base and then to form a spherical crystal out of a portion of the projection.
Figure 2B:
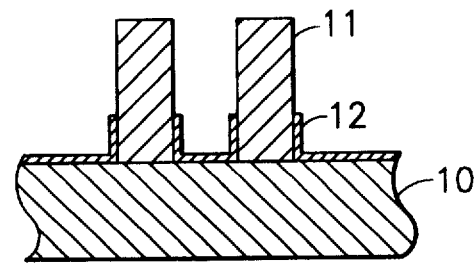
Figure 2C:
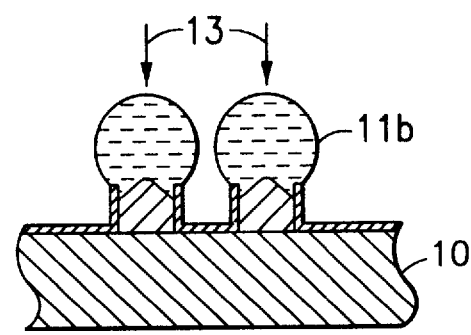
Figure 2D:
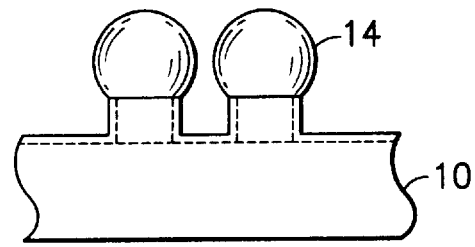
Figure 3A:
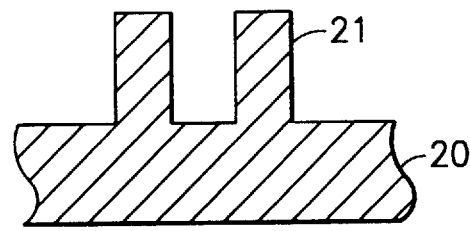
FIGS. 3(a)–(d) are drawings for the purpose of describing the concepts involved in the four processes used to integrally form a crystal base and a projection and then to form a spherical crystal out of the entire projection.
Figure 3B:
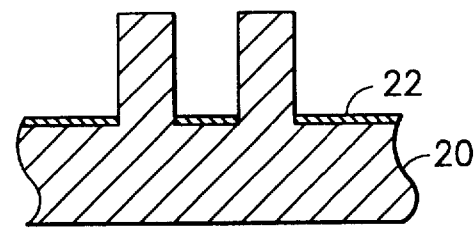
Figure 3C:
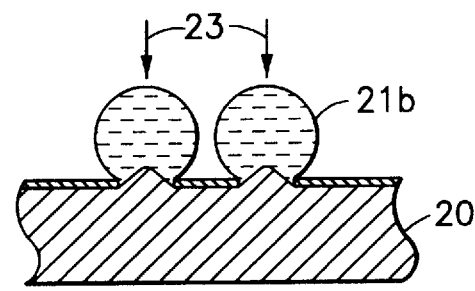
Figure 3D:
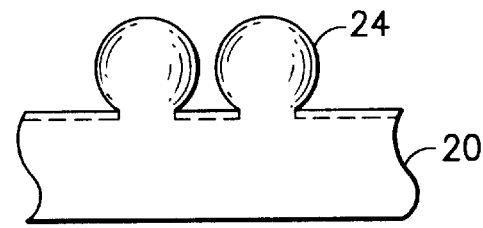
Figure 4A:
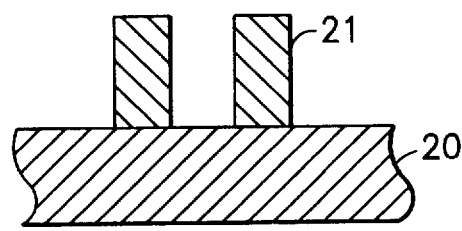
FIGS. 4(a)–(d) are drawings for the purpose of describing the concepts involved in the four processes used to integrally fix a projection to a crystal base and then to form a spherical crystal out of the entire projection.
Figure 4B:
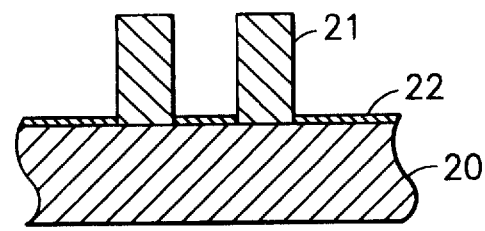
Figure 4C:
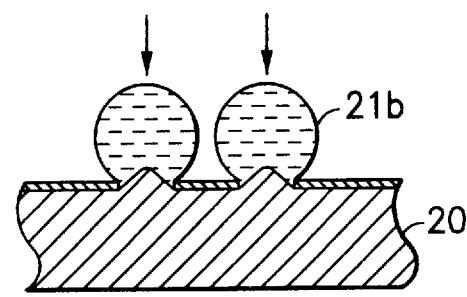
Figure 4D:
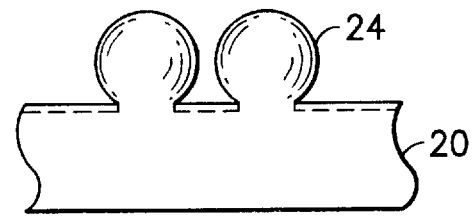

Referring to the drawings, the following is a description of the embodiments of the present invention.

Embodiment 1

First, in the first process, a crystal substrate 30 (corresponding to the crystal base) is prepared. Crystal substrate 30 is a square plate comprising silicon single crystals, has a thickness of 2.0 mm and its main surface has a crystal orientation index of (111).

Figure 5:
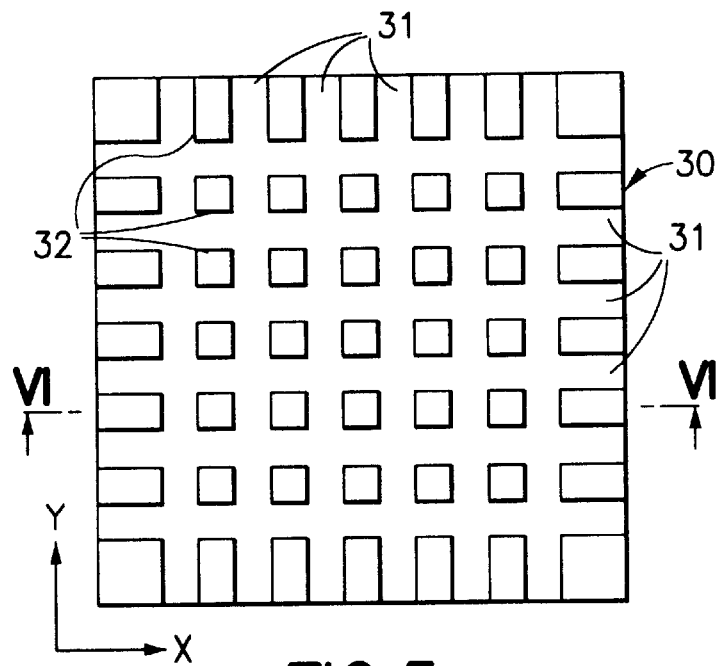
FIG. 5 is a plan drawing of a crystal base and a projection relating to embodiment 1 of the present invention.
Figure 6:
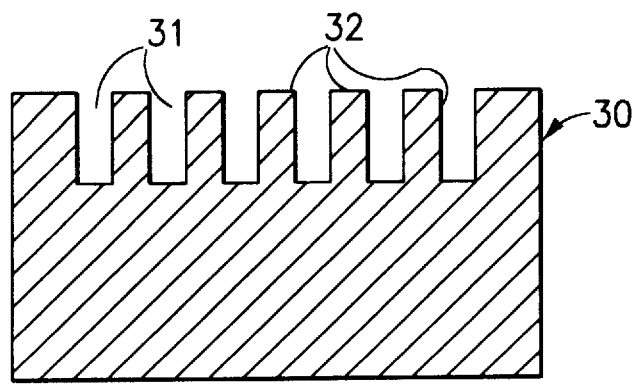
FIG. 6 is a cross-section drawing along the VI—VI line in FIG. 5.

Referring to FIG. 5 and FIG. 6, in the second process, six sets of grooves 31 are formed with a diamond multi-blade saw along the X axis and the Y axis of crystal substrate 30. Each groove 31 has a depth of 1.0 mm and a width of 0.5 mm. As a result, square, pillar-shaped projections 32 comprising silicon single crystals form a 5-by-5 matrix on crystal substrate 30, excluding the outer rim areas. Each projection 32 has a tip surface of 0.25 mm-by-0.25 mm, and a height of 1.0 mm. Each projection 32 is connected integrally at its base with crystal substrate 30, made from the original silicon single crystals.

The surfaces processed with the saw as described above have some process-induced defect layers. In order to eliminate these processing-altered layers, in the third process light etching is performed on the side of crystal substrate 30 having projections 32. This is a known technique. In this case, etching is performed with an etchant comprising a mixed acid made from hydrofluoric acid and nitric acid diluted in water.

Figure 7:
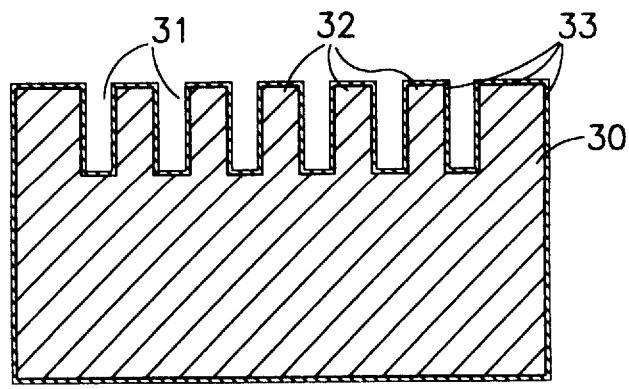
FIG. 7 is a drawing corresponding to the drawing in FIG. 6 where a silicon oxide film is formed.

Next, in the fourth process, crystal substrate 30, on which are projections 32, is placed in a thermal oxidation furnace and oxidized for a prescribed amount of time in a temperature of about 1000 degrees C. Referring to FIG. 7, a silicon dioxide film 33, comprising $SiO_2$ having a thickness of 0.5–1.0 microns, is formed over the entire surface of crystal substrate 30, to which projections 32 are attached. This silicon dioxide film 33 has a higher melting point than silicon single crystals. It tends not to react chemically with molten silicon and also has a low wettability relative to molten silicon.

Silicon dioxide film 33 does not need to be formed over the entire surface of crystal substrate 30, and need only be formed at least on the entire surface of projections 32.

Figure 8:
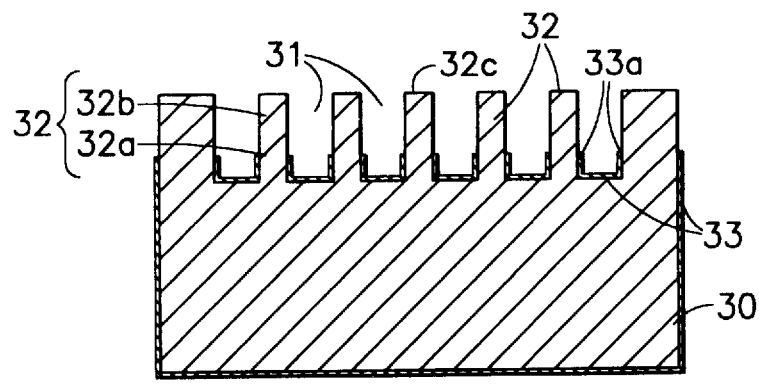
FIG. 8 is a drawing corresponding to the drawing in FIG. 6 where a flow regulating film is formed.

Tip portions 32b comprise everything past bases 32a (approximately 0.2 mm in length), located 0.8 mm from the tips of projections 32. Referring to FIG. 8, in the fifth process, silicon dioxide film 33 is eliminated from the entire surface of tip portions 32b (approximately 0.8 mm in length). As a result, flow regulating films 33a, which are made from silicon dioxide film 33, are formed over the entire outer surface of bases 32b of projections 32. When a portion of silicon dioxide film 33 is to be eliminated, a photo-resist approximately 0.2 mm in thickness is applied to the bottoms of grooves 31 of crystal substrate 30. Silicon dioxide film 33 is then eliminated by etching with diluted hydrofluoric acid or the like.

When tip portions 32b of projections 32 are melted in the next process, flow regulating films 33a serve to regulate the flow of the silicon single crystal melt along the surface of bases 32a of projections 32.

Next, for the sixth process, a carbon dioxide laser that produces a laser beam is prepared. The laser beam serves as a heating beam for melting tip portions 32b of the plurality of projections 32 formed on crystal substrate 30. The oscillating frequency of the laser beam from this carbon dioxide laser device is 10.6 microns, the output of the carbon dioxide laser device is 30 watts, and the pulse-repetition frequency is 5 kHz. A focusing lens is used so that the beam diameter of the laser beam is approximately 0.1 mm. The atmosphere in which the laser is applied is air, and resistive heating is performed before application of the laser to preheat crystal substrate 30 to approximately 127 degrees C.

Figure 9:
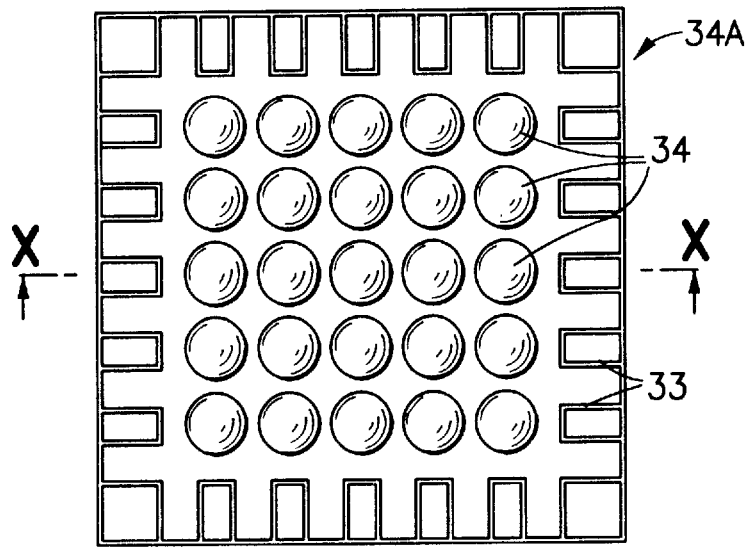
FIG. 9 is a plan drawing of a spherical crystal array containing 25 spherical crystals.
Figure 10:
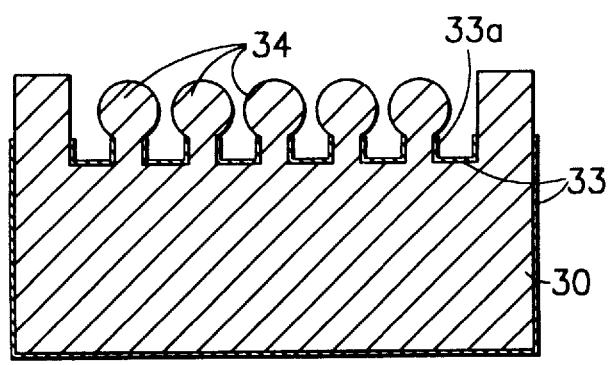
FIG. 10 is a cross-section drawing along the X—X line in FIG. 9.

Next, in the seventh process, crystal substrate 30, on which projections 32 are attached, is attached to a carrier so that tip surfaces 32c of projections 32 are pointed downward. The carrier can move two-dimensionally, in the X and Y directions. Crystal substrate 30 is moved in the X direction at a speed of 0.5 mm/sec so that the laser beam is scanned along the X direction over a row of five tip surfaces 32c on projections 32. The carrier is then moved by one pitch in the Y direction, and the scan is repeated. Thus, a laser beam is scanned in sequence perpendicularly over tip surfaces 32c of projections 32 for each of the rows. When the laser beam is applied, tip portion 32b of projection 32 on which the laser is applied melts instantaneously. The molten melt increases in volume and grows in a spherical shape. A spherical shape is maintained because of surface tension and the flow regulating activity of flow regulating film 33a. When application of the laser stops, the melt solidifies instantaneously into a spherical crystal 34 comprising the same silicon single crystal as projection 32. Referring to FIG. 9 and FIG. 10, spherical crystal 34 grows integrally at the end of base 32a of projection 32, which serves as the seed crystal. Spherical crystal 34 has a diameter of approximately 0.45 mm and the surface is spherical with a smooth luster.

Referring to FIG. 9 and FIG. 10, in this manner 25 spherical crystals 34 comprising silicon single crystals are made in an extremely short period of time. The theory behind how spherical crystals 34 form ideal spherical silicon single crystals is described in claim 1 as well as in the advantages of the invention, so this will be omitted here to prevent overlapping.

Spherical crystal array 34A, made as described above, comprises: a crystal substrate 30 comprising silicon single crystals; a plurality of bases 32a (bases 32a of projections 32) comprising silicon single crystals and arranged to form a 5-by-5 matrix; and spherical crystals 34 roughly spherical in shape, formed integrally at the tips of the plurality of bases 32a and comprising silicon single crystals. After this spherical crystal array 34A is made, it can be applied to various electronic devices, optical elements, functional elements, and the like. This can be done by introducing impurities for doping on the surfaces of each of the plurality of spherical crystals 34, growing thin crystal layers using vapor phase deposition technique or the like, forming integrated circuits, with connecting electrodes and thin metallic wires.

Furthermore, spherical crystals 34 can be cut away from crystal substrate 30 so that they can be used as new electronic devices, optical elements or functional elements that are spherical in shape.

In particular, spherical crystal arrays can be effective for light-emitting diodes that can emit light in the same manner in any direction. Also, they are effective for photo-diodes and solar cells, since they can absorb light from any direction and they have a large surface area.

Also, by disposing a common electrode on crystal substrate 30, the wiring structure for the spherical crystals can be simplified.

Embodiment 2

(see FIG. 11–FIG. 16)

In this embodiment, the only difference with embodiment 1 is the fact that projections 32A are formed in a cylindrical shape rather than a square column shape. Therefore, elements that have identical functions as those in embodiment 1 above are given identical or similar numerals and the descriptions are omitted.

Figure 11:
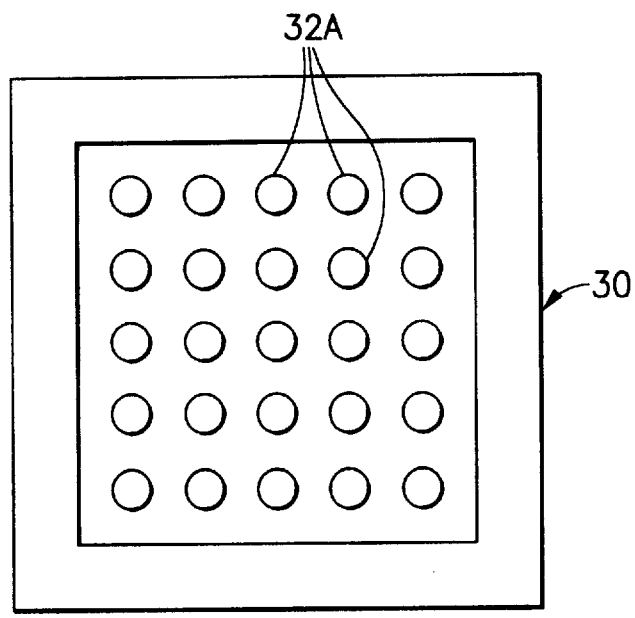
FIG. 11 is a plan drawing of the crystal base and the projection relating to embodiment 2 of the present invention.
Figure 12:
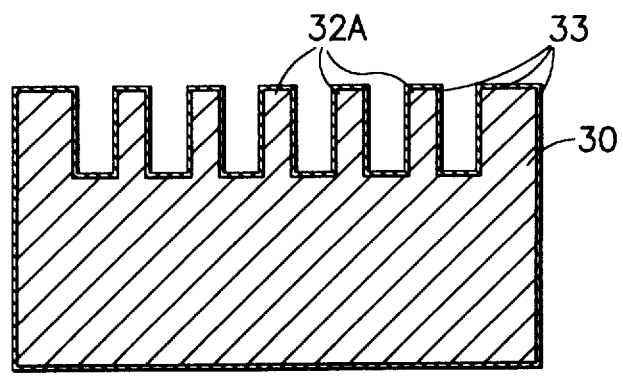
FIG. 12 is a cross-section drawing of the crystal base, the projection and the silicon oxide film in FIG. 11.
Figure 13:
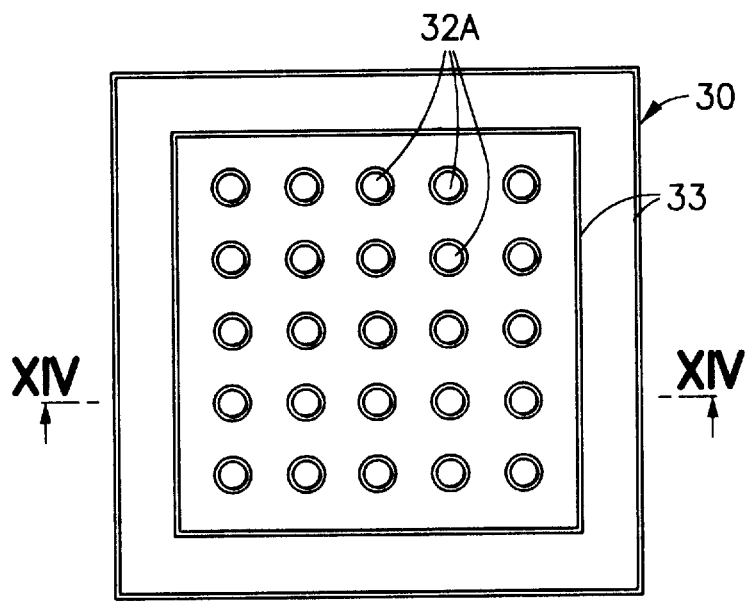
FIG. 13 is a plan drawing of the crystal base, the projection and the flow regulating film in FIG. 11.
Figure 14:
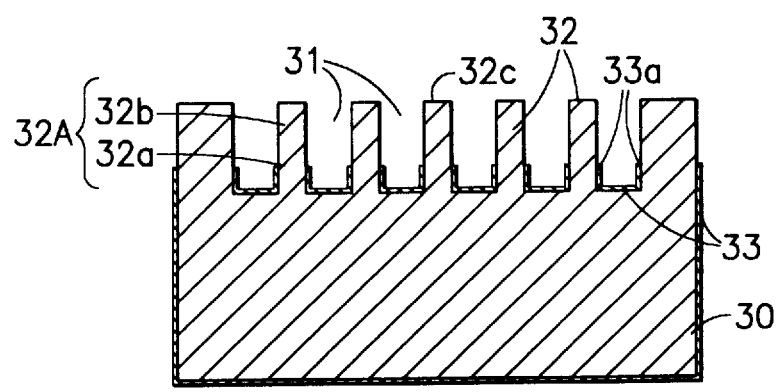
FIG. 14 is a cross-section drawing along the XIV—XIV line in FIG. 13.
Figure 15:
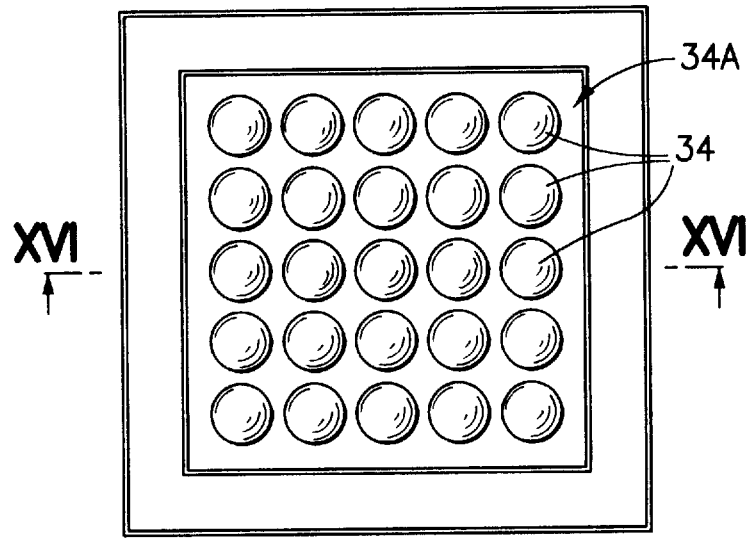
FIG. 15 is a plan drawing of the spherical crystal array formed on a crystal base shown in FIG. 11.
Figure 16:
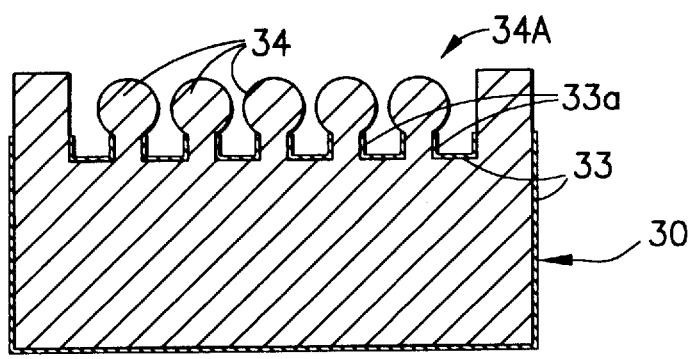
FIG. 16 is a cross-section drawing along the XVI—XVI line in FIG. 15.

First, the first process is performed as in embodiment 1. Referring to FIG. 11, in the second process, ultrasonic processing is used to form cylindrical projections 32A in a 5-by-5 matrix on the surface of crystal substrate 30, which has a thickness of approximately 2.0 mm and comprises silicon single crystals. In this case, a slurry containing SiC or $Al_2O_3$ powder (polishing powder) is fed to the end of a DI horn while it vibrates ultrasonically. The DI horn is pressed against the surface of crystal substrate 30, and the substrate is processed to form cylinders in the same shape as the DI horn due to the impact of the polishing powder. The dimensions of projections 32A can be, for example, 0.15 mm diameter and 1.0 mm height.

The cylindrical projections 32A have more symmetry than the square column shaped projections 32 in embodiment 1. This provides superior spherical symmetry in spherical crystals 34A.

Embodiment 3

Figure 17:
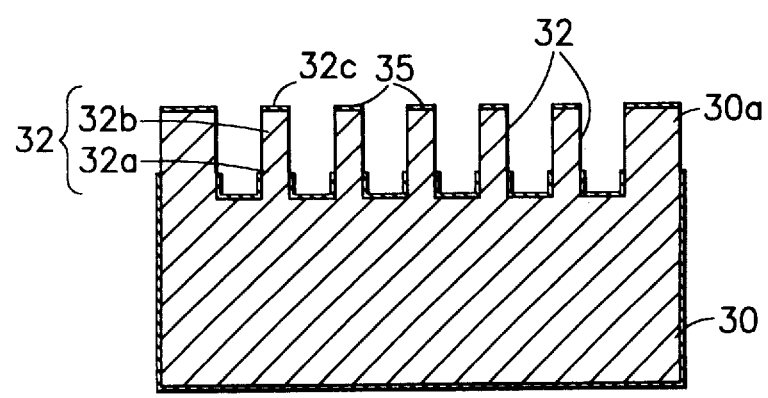
FIG. 17 is a cross-section drawing of the crystal base, the projection and the flow regulating film relating to embodiment 3.

(see FIG. 17)

The first process through the fifth process in embodiment 3 are identical to the first process through the fifth process in embodiment 1, so their descriptions will be omitted here.

Referring to FIG. 17, in the sixth process following the fifth process, germanium films 35 are formed on tip surfaces 32c of projections 32 by vacuum evaporating for silicon and germanium mixed crystal formation at a thickness of approximately 1.0 microns on the tip surfaces of the 25 projections 32 on crystal substrate 30.

One way to form germanium films 35 is to apply a photo resist over the surface of crystal substrate 30 excluding the areas where germanium films 35 are to be formed. Then, germanium would be vacuum-evaporated and the photo resist would be eliminated.

A seventh process, identical to the sixth process in embodiment 1, is then performed and spherical crystals comprising mixed single crystals of silicon and germanium are formed. However, a hydrogen gas atmosphere is used rather than air for heating, melting and solidification. Elements identical to elements in embodiment 1 are given identical numbers and the descriptions are omitted. The theory behind how these spherical crystals are ideal spherical crystals is described in the explanation of claim 1, and they will be omitted here to avoid overlap.

The mixed single crystals of silicon and germanium have an energy gap in the forbidden band that is smaller than that of silicon and larger than that of germanium. These crystals have properties that can be used in the production of photo diodes and high-speed transistors built in heterojunctions.

The spherical crystal array formed on a crystal substrate as described above comprises: a crystal substrate 30 comprising silicon single crystals; a plurality of bases 32a (bases 32a of projections 32) comprising silicon single crystals and arranged in a 5-by-5 matrix on crystal substrate 30; and spherical crystals roughly spherical in shape formed integrally on the ends of each of the plurality of bases 32a and comprising single crystals of silicon-germanium mixed crystals.

In this embodiment 3, the spherical crystals are formed as single crystals of silicon-germanium mixed crystals. However, it would also be possible to substitute the germanium film 35 described above with a film of phosphorous, arsenic, antimony or the like to serve as an impurity for doping (an impurity as a donor). Alternatively, a film of boron, aluminum, gallium, indium or the like can be formed as an impurity for doping (an impurity as an acceptor). In these cases, the spherical crystals can form type n- or type p- semiconductor single crystals. Instead of in the form of films, it is possible to introduce these impurities for doping into spherical crystals through using chemical vapor deposition in the gas phase or using impurity diffusion in the gas phase.

Furthermore, it is possible to stack type n- and type p- semiconductor single crystal layers on the surface of spherical crystals made from type n- or type p- semiconductor single crystals. This can be done by forming an oxide film and etching, vapor phase growth and the like. By forming electrodes or circuits using the evaporation method and photo-etching, it would be possible to form various electronic devices such as integrated circuits, light-emitting diodes, photo-diodes, and the like on the surface of the spherical crystals. These things can also be done with the spherical crystals in embodiment 1 and the spherical crystals in embodiment 2.

Embodiment 4

(drawings omitted)

In embodiment 4, the first process involves the preparation of a crystal substrate comprising silicon single crystals that do not have a high degree of purity. The substrate has a thickness of 2.0 mm and the main surface has a crystal orientation index of (111).

The second process through the sixth process are identical to the second process through the sixth process in embodiment 1, so the descriptions will be omitted. However, in this case what is formed are spherical crystals comprising silicon single crystals, and impurities are segregated on the surface of these spherical crystals. As noted in claim 1 and the section on the advantages of the invention, when the spherical crystal is being formed, crystal growth proceeds from the unmelted portion of the projection (i.e. the base of the projection), and solidification proceeds from the center of the sphere toward the surface. This results in the impurities contained in the silicon single crystals being segregated to the surface of the spherical crystal.

In the seventh process following the sixth process, the surfaces of the plurality of spherical crystals are etched. The segregated impurities and silicon oxide films on the surfaces are removed.

If a silicon polycrystal crystal substrate is used for the crystal substrate, it is still possible to perform etching as described in the seventh process as described above to remove the segregated impurities and silicon oxide films on the surfaces.

Embodiment 5

(drawings omitted)

In embodiment 5, the first process involves preparing a crystal substrate comprising silicon single crystals that do not have a high degree of purity, as in embodiment 4. The substrate has a thickness of 2.0 mm and the main surface has a crystal orientation index of (111).

The second process through the sixth process are identical to the second process through the sixth process in embodiment 1, so their descriptions will be omitted. In this case, the results are spherical crystals of silicon single crystals, and impurities are segregated on the surfaces of the spherical crystals.

In the seventh process, as in the seventh process in embodiment 4, the surfaces of the plurality of spherical crystals are etched to remove the silicon oxide films and the segregated impurities.

In the eighth process, the plurality of spherical crystals, from which impurities were eliminated in the seventh process, are melted again by a laser beam as in the sixth process in embodiment 1. The crystals solidify and are recrystallized. With this recrystallization, impurities are again segregated on the surface of the spherical crystal, so the seventh and eighth processes are repeated multiple times.

In this way, the degree of purity in each of the spherical crystals can be improved, making it possible to provide very pure spherical silicon single crystals. Thus, since impurities contained in spherical crystals can be removed, it is possible to use crystal substrates made from less pure material, such as metallurgical-grade silicon polycrystals. This would be significantly less expensive compared to crystal substrates made from silicon single crystals. Thus, it is possible to make spherical crystal arrays at relatively low costs. As the diameter of the spherical crystals gets smaller, the crystals will tend to become single crystals. Also, since the ratio of surface area to volume will increase, there is a stronger impurity "getter" effect from the surface.

Embodiment 6

(no drawings)

Impurities and silicon dioxide films on the surfaces of the plurality of spherical crystals made according to the method described in embodiment 5 are etched and removed.

Next, the crystal substrate on which the spherical crystals are formed are placed in a thermal oxidation furnace as in the fourth process in embodiment 1. A silicon dioxide film (having a thickness of 1.0 microns, for example) in which there is phosphorous doping is formed on the surfaces of the spherical crystals and on the other surfaces. Next, heat is applied, at 1000–1200 degrees C for example, to the plurality of spherical crystals and the crystal substrate so that the impurities within the spherical crystals are gettered by the oxide film. Then, the surfaces of the spherical crystals are etched to remove the oxide film in which the impurities have been gettered. Even by repeating the seventh and eighth processes in embodiment 5, it is still difficult to completely eliminate elements on which there is not much segregation and which have high coefficients of diffusion (e.g. Au, Ag, Cu in silicon crystals). The processing in this embodiment makes it possible to almost completely remove the impurities from elements with high coefficients of diffusion.

The processing described in embodiment 6 can also be applied to the spherical crystals made according to the methods described in embodiments 1 through 4.

Embodiment 7

(no drawings)

In embodiment 7, annealing is performed on the spherical crystals when there are problems involving internal stress or crystal defects that occur within the crystals during growth.

First, the spherical crystal array made according to the method described in embodiment 1 is placed in a heating furnace and heated at a selected temperature, such as a temperature within the range of 700–1200 degrees C. Then, the heated spherical crystal array is removed from the heating furnace and cooled to room temperature. By annealing the spherical crystal array in this manner it is possible to reduce internal stress and crystal defects. The method used in this embodiment 7 can also be applied to the spherical crystal arrays made according to the methods in embodiments 1 through 6.

Embodiment 8

Figure 18:
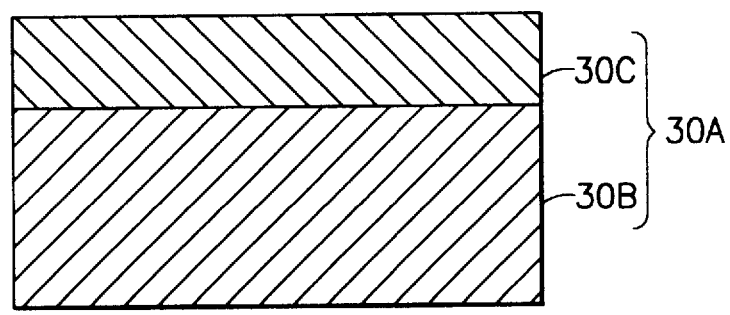
FIG. 18 is a cross-section drawing of the crystal base relating to embodiment 8.
Figure 19:
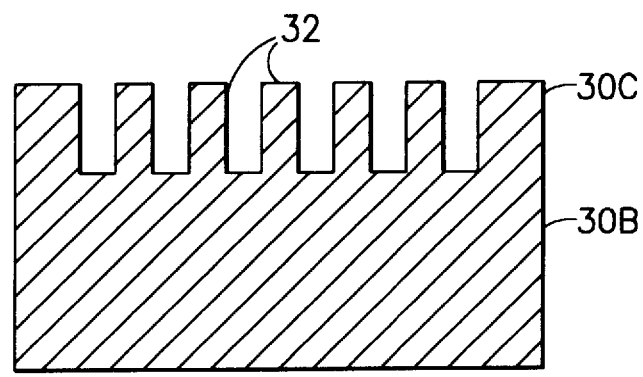
FIG. 19 is a cross-section drawing of the crystal base and the projection in FIG. 18.

(see FIG. 18 and FIG. 19)

Referring to FIG. 8, in the first process in embodiment 8 a polycrystal substrate 30B having a thickness of 1.5 mm and comprising a silicon that does not have a high degree of purity is used. A single crystal substrate 30C having a thickness of 1.0 mm, comprising a silicon single crystal, and having crystal orientation index of (111) is also prepared. Single crystal substrate 30C is adhered to the upper surface of polycrystal substrate 30B using a known thermal pressure bonding method. This results in a crystal substrate 30A.

Processes 2 through 6, which are similar to processes 2 through 6 from embodiment 1, are performed on crystal substrate 30A to form 25 spherical single crystals.

In other words, since projection 32 comprises silicon single crystals, it is possible to make spherical crystals comprising silicon single crystals. And, since it is possible to use an inexpensive polycrystal substrate 30B for all the parts in crystal substrate 30A except for the parts that form projections 32, it is possible to make a relatively inexpensive spherical crystal array.

Embodiment 9

Figure 20:
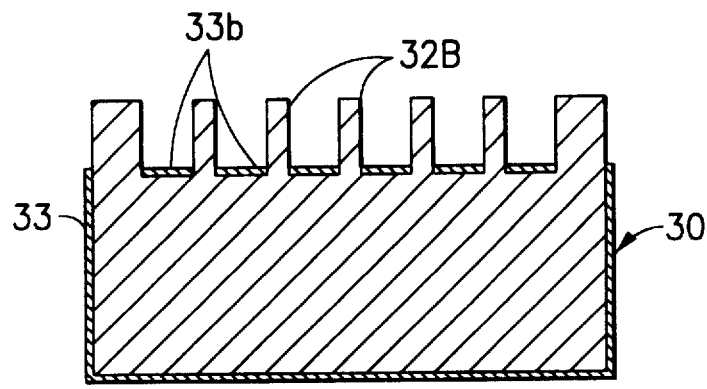
FIG. 20 is a cross-section drawing of the crystal base, the projection and the flow-regulating film relating to embodiment 9.
Figure 21:
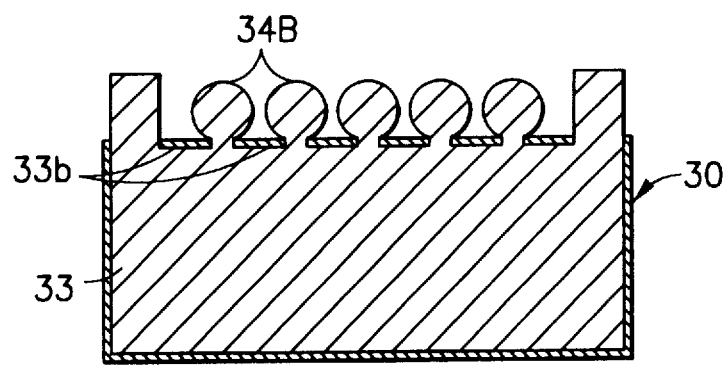
FIG. 21 is a cross-section drawing of a spherical crystal array formed on the crystal base in FIG. 20.

(see FIG. 20 and FIG. 21)

In the first process in embodiment 9, a crystal substrate 20 comprising a silicon single crystal having a thickness of 2.0 mm is prepared, as in the first process in embodiment 1.

Next, in the second process, 25 projections are formed in a 5-by-5 matrix as in the second process in embodiment 2. However, these projections 32B are shorter than the projections 32 from embodiment 1, and can be, for example, approximately 0.8 mm in height. Next, the third process and the fourth process, which are similar to the third and fourth processes from embodiment 1, are performed. In the fifth process, the silicon dioxide film is partially removed, as in the fifth process from embodiment 1. However, in this fifth process, the silicon dioxide film 33 is removed over the whole outer surface of projection 32B along its full height, as shown in FIG. 20.

Then, in this case, the silicon dioxide film 33 that remains around the base of projection 32B forms a flow regulating film 33b. In the next, sixth process, this flow regulating film 33b regulates the flow of the molten silicon melt along the surface of crystal substrate 30. In the sixth process, which is roughly similar to the sixth process from embodiment 1, a laser beam scan is performed. However, during this heating and melting, solidification and crystallization take place after each projection 32B has melted completely. Even in this case, when spherical crystal 34b solidifies, the surface tension of the silicon melt and the flow regulation by the flow regulating film 33b result in a spherical crystal having a roughly spherical shape with no collapse in shape.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

The following is a description of various forms of the present invention that can be implemented by applying the embodiments described above or making partial changes in the embodiments described above.

1) All of the above embodiments involved the formation of spherical crystals in environments having a gravity of 1G. However, it would also be possible to implement the present invention in environments of zero-gravity or micro gravity for the steps after the process for melting the projections, and at least the process for solidifying the molten crystals.

In this case, gravity has almost no effect on the melt at the molten portion, thus making the surface tension of the melt even more dominant. This permits the formation of spherical crystals that are more truly spherical. This is especially effective in growing spherical crystals when the volume of the melt is large or the effect of its weight is significant.

In normal gravity, temperature distribution in the melt can cause convection and agitate the melt. Also, the use of elements with different specific gravities in compounds and mixed crystals can lead to localized non-uniformities. These problems do not occur in micro gravity conditions.

2) There are cases where it would be desirable to use an inert gas atmosphere, such as argon, helium or nitrogen, according to the material to be melted. This would be done in at least the process for melting and the process for crystallizing and solidifying.

If the material to be melted is, for example, arsenic, which is an element in the crystallization of gallium arsenide, there would be a high equilibrium vapor pressure and it would be possible for the material to decompose and evaporate during melting. In such cases, it would be desirable grow the spherical crystals in the inert gasses mentioned above at a high gas pressure setting. It would also be possible to set the inert gas atmosphere temperature so that the heat dissipation from the melt surface is decreased.

3) In the atmosphere used in the embodiments described above, it would also be possible to introduce impurities for doping into the spherical crystals by using an atmosphere containing the impurities for doping. This would be done for the process for melting the projections and the process for crystallizing and solidifying.

4) Instead of using the carbon dioxide gas laser described in the embodiments above, it would also be possible to use YAG lasers and Q-switched ruby lasers. It would be possible to use lasers with different wavelengths corresponding to the type of material to be melted, and the spherical crystals can be formed by melting at least a portion of the projection or the entire projection.

Furthermore, instead of the laser described above, it would be possible to melt the material by using an infrared beam focussed narrowly with a condensing lens. Also, a narrowly focused electron beam can be used instead of a laser or an infrared beam in order to melt and solidify in a vacuum atmosphere. Furthermore, instead of a narrowly focussed heating beam, it would not be impossible to have a heating beam having a prescribed width heat and melt multiple rows by scanning or without scanning.

5) The crystal substrate described above does not necessarily need to be formed in a plate shape, and can also be formed as a rod or in a bulk. Also, the projections described above do not necessarily need to be formed as square columns, and can be formed as circular columns as well. If circular columns can be formed economically, it would be desirable to use circular columns, since projections that are shaped as circular columns can form spherical crystals that are more perfectly spherical.

6) In the embodiments described above, the projections are formed integrally on the crystal base (crystal substrate). However, it would be possible to not form the projections integrally with the crystal base and to make the projections separately from metal or metal oxide or non-metallic crystals or from semiconductor single crystals. The projection can then be adhered or bonded to the surface of a crystal base that is a metal, a metal oxide or a non-metallic material. It would also be possible to melt, crystallize and solidify at least a portion of the projection, the entire projection, or the entire projection and a portion of the crystal substrate. In these cases it would also be necessary to have the configuration be able to absorb heat reliably from the projections to the crystal substrate.

7) For the crystal substrate and the projections formed integrally with the crystal substrate or the projections adhered or bonded to the crystal substrates, it would be possible to use silicon single crystals, silicon single crystals or polycrystals that do not have a high degree of purity, or germanium single crystals or polycrystals that do not have a high degree of purity, or other various types of semiconductors, dielectrics, magnetic bodies or superconductors.

The following are examples of materials that can be used for forming spherical crystals according to the method of the present invention.

| a) Metal oxide single crystals | |
|---|---|
| $Nd_3Ga_5O_2$ | |
| $LiTaO_3$ | Dielectric crystal, pyroelectric material |
| $LiNbO_3$ | Same as above |
| $PbTiO_3$ | Same as above |
| GGG ($Gd_3Ga_5O_{12}$) crystal | magnetochemical |
| YAG ($Y_3Al_5O_{12}$) (dope with $Nd^{3-}$) | optical crystal for use in lasers |
| $Al_2O_3$ | Same as above (dope with $Cr^{3+}$) |
| b) Compound semiconductor crystals | |
| GaAs, GaP, InAs, InSb, GaSb, InP | III–V group |
| ZnS, ZnSe, CdTe | II–VI group |
| SiC | IV—IV group |

-continued c) mixed crystalline semiconductors

| | |
|---|---|
| $Si_xGe_{1-x}$ | IV—IV group |
| $AlGa_{1-x}P$ | III–V group |
| $AlGa_{1-x}As$ | III–V group |
| $AlGa_{1-x}Sb$ | III–V group |
| $Ga_xIn_{1-x}P$ | III–V group |
| $Ga_xIn_{1-x}Sb$ | III–V group |
| $Ga_xIn_{1-x}As_yP_{1-y}$ | III–V group |
| $ZnS_xSe_{1-x}$ | II–VI group |
| $Cd_{1-x}Zn_xTe$ | II–VI group |
| $Hg_{1-x}Cd_xSe$ | II–VI group |
| $Pb_{1-x}Sn_xTe$ | IV–VI group |
| $Pb_{1-x}Sn_xSe$ | IV–VI group |

8) For the crystal base described above, it would be possible to use: metallic single crystals, intermetallic compound crystals and polycrystals; metal oxide single crystals, mixed metal oxide single crystals and polycrystals; non-metallic single crystals, mixed non-metallic single crystals and polycrystals; or various combinations of these materials.

The projections formed integrally with or separate from the crystal base can comprise: metallic single crystals, intermetallic compound single crystals and polycrystals; metal oxide single crystals, mixed metal oxide single crystals and polycrystals; non-metallic single crystals, mixed non-metallic single crystals and polycrystals; or various combinations of these materials. Spherical crystal arrays using metal or metal oxide can be used industrially as a discharge electrode unit containing a plurality of discharge electrodes.

9) The spherical crystal arrays described above can be processed with vapor phase growth, vapor phase diffusion, oxide film formation, electrode formation and the like so that each spherical crystal in the spherical crystal array can form a photodiode. This will result in a good optical sensing element that can detect light coming in from various directions.

10) In the above embodiment, the projections are supported pointing downward while melting and solidification take place. However, it is not impossible for melting and solidification to take place while the projections are pointing upward.

Figure 22:
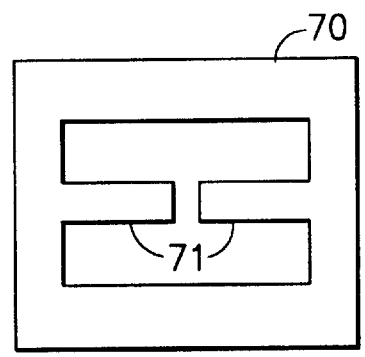
FIG. 22 is a plan drawing of the projection and the crystal base relating to an alternative embodiment.
Figure 23:
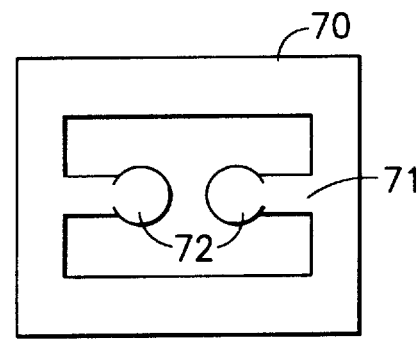
FIG. 23 is a plan drawing of the crystal base and the spherical crystal made from the configuration in FIG. 22.
Figure 24A:
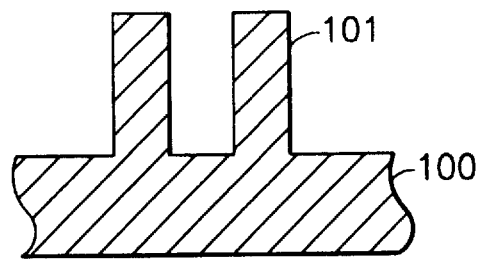
FIG. 24(a) is a cross-section drawing of the crystal base and the projection relating to the prior art.
Figure 24B:
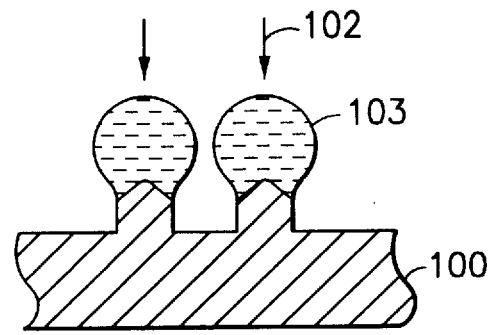
FIG. 24(b) is a cross-section drawing of the crystal base and the spherical melt.
Figure 24C:
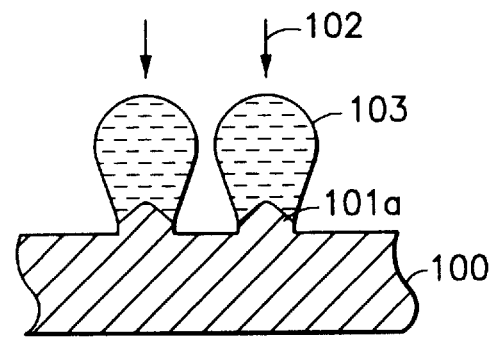
FIG. 24(c) is a cross-section drawing of the crystal base and the spherical melt.

11) Referring to FIG. 22, instead of the projections in the embodiment above, it would also be possible to form a pair of projections 71 projecting integrally from crystal substrate 70 so that they are facing each other. A heating beam would be applied to the tips of projections 71 so that they are melted and then solidified, thus forming spherical crystals 72 on the tips of projections 71. In this case, flow regulating film is formed as in the embodiments above.

12) In the above embodiments, the projections are positioned on the bottom side of the crystal base, and the laser is applied from the bottom of the projections to the tip of the projections. However, it would also be possible to position the projections on the top side of the crystal base and have the laser applied from above to the tip of the projections.

13) The spherical crystals formed according to the methods described in the above embodiment can be made separately from the crystal substrate after integrated circuits, electrodes and terminals are installed, or before they are installed. They can then be used as electronic devices, optical elements, functional electronic elements and the like.

14) The spherical crystals described above is formed using a heating beam. Depending on the application, the heating beam can be a plurality of lasers having the same wavelength, or a plurality of lasers having different wavelengths, or a plurality of condensed infrared beams, or a combination of these.

15) Besides using a diamond multi-blade saw or ultrasonic processing, the projections can be formed on the crystal substrate using chemical etching, sand blasting, vapor phase epitaxial growth, or the like.

16) Regarding the flow regulating film, it would be desirable for the film to comprise a passivation film that has a melting point that is higher than the material to be grown as a crystal, that has a low wettability relative to the material to be grown as a crystal, that reacts chemically with the melt, and that does not thermally decompose at high temperatures. If the material to be grown as a crystal is silicon, then silicon dioxide film, silicon nitride film, aluminum oxide film and the like can be used in the flow regulating film. If the material to be grown as a crystal is gallium arsenide, indium, phosphide, or the like, then silicon oxide film, silicon nitride film, aluminum oxide film and the like can also be used in the flow regulating film. Also, in this case the flow regulating film can be formed using chemical vapor phase growth (CVD).

What is claimed is:

1. A method for making spherical crystals comprising:
    forming at least one thin projection, wherein said projection comprising a crystal made from a member of the group consisting of a metal, a metal oxide, and a non-metallic material projects from a surface of a crystal base comprising a member of the group consisting of a metal, a metal oxide, and a non-metallic material;
    forming a flow regulating film, having a higher melting point than the melting point of said crystal of said projection, over said surface of said crystal base excluding an area proximate to a tip of said projection;
    applying a heating beam to said tip of said projection effective to melt a portion of said projection exposed past said flow regulating film toward said tip to form a molten portion; and
    halting application of said heating beam on said projection so that said molten portion is solidified into a spherical crystal having substantially a spherical shape.

2. A method for making spherical crystals according to claim 1 wherein:
    at least said fourth process is performed in zero gravity or microgravity.

3. A method for making spherical crystals according to claim 1 further comprising:
    a fifth process, wherein a second surface of said solidified spherical crystal is etched to remove impurities accumulated on said second surface of said spherical crystal.

4. A method for making spherical crystals as described in claim 1 further comprising the following two steps performed at least once:
    a fifth process, wherein a second surface of said solidified spherical crystal is etched to remove impurities accumulated on said second surface of said spherical crystal; and
    a sixth process, wherein said spherical crystal, from which impurities were removed in said fifth process, is melted again and solidified effective to recrystallize said spherical crystal in a substantially spherical shape.

5. A method for making spherical crystals as described in claim 4 wherein:
    after said sixth process, a first oxide film on said second surface of said solidified spherical crystal is removed, a second oxide film is formed on said surface of spherical crystal; and
    heat is applied to said solidified spherical crystal effective to cause absorption of impurities in said solidified spherical crystal by said second oxide film.

6. A method for making spherical crystals as described in claim 1 wherein:
   annealing is performed on said solidified spherical crystal in order to decrease internal stress and lattice defects in said solidified spherical crystal.

7. A method for making spherical crystals as described in claim 1 wherein:
   a first oxide film is removed from a second surface of said solidified spherical crystal;
   a second oxide film is formed on said second surface of said solidified spherical crystal; and
   heat is applied to said solidified spherical crystal effective to cause said second oxide film to absorb impurities from said solidified spherical crystal.

8. A method for making spherical crystals comprising the steps of:
   a first process, wherein one or more thin projections are formed so that they project integrally from a semiconductor crystal base;
   a second process, wherein a flow regulating film having a higher melting point than the melting point of said semiconductor is formed over an entire outer surface of a base portion, excluding a portion of said outer surface proximate to a tip of said projection;
   a third process, wherein a heating beam is applied to said tip of said projection to melt a portion of said projection past said flow regulating film toward said tip to form a molten portion; and
   a fourth process, wherein the application of said heating beam on said projection is halted, and said molten portion is solidified into a spherical crystal having substantially a spherical shape.

9. A method for making spherical crystals as described in claim 8, wherein:
   said semiconductor crystal base is a semiconductor polycrystal base that does not have a high degree of purity.

10. A method for making spherical crystals according to claim 8, wherein:
    a semiconductor single crystal is used for said semiconductor crystal base.

11. A method for making spherical crystals comprising the steps of:
    a first process, wherein one or more thin projections comprising a semiconductor crystal are formed so that they project from a semiconductor crystal base;
    a second process, wherein a flow regulating film having a higher melting point than the melting point of said semiconductor of said projection is formed over an outer surface of a base portion, excluding a portion of said outer surface proximate to a tip of said projection;
    a third process, wherein a heating beam is applied to said tip of said projection to melt a portion of said projection past said flow regulating film toward said tip to form a molten portion; and
    a fourth process, wherein the application of said heating beam on said projection is halted, and said molten portion is solidified into a spherical crystal having substantially a spherical shape.

12. A method for making spherical crystals according to claim 11 wherein:
    a semiconductor single crystal is used for said semiconductor projection.

13. A method for making spherical crystals comprising the steps of:
    a first process, wherein one or more thin projections comprising a crystal made from a metal or a metal oxide or a non-metallic material are formed so that they project from a surface of a crystal base comprising a metal or a metal oxide or a non-metallic material;
    a second process, wherein a flow regulating film having a higher melting point than the melting point of said crystal of said projection is formed on said surface of said crystal base;
    a third process, wherein a heating beam is applied to a tip of said projection to melt the entirety of said projection to form a molten portion; and
    a fourth process, wherein the application of said heating beam on said projection is halted, and said molten portion is solidified into a spherical crystal having a substantially spherical shape.

14. A method for making spherical crystals comprising:
    a first process, wherein one or more thin projections are formed so that they project integrally from a surface of a semiconductor crystal base;
    a second process, wherein a flow regulating film having a higher melting point than the melting point of said semiconductor is formed on said surface of said semiconductor crystal base;
    a third process, wherein a heating beam is applied to a tip of said projection to melt the entirety of said projection to form a molten portion; and
    a fourth process, wherein the application of said heating beam on said projection is halted, and said molten portion is solidified into a spherical crystal having a substantially spherical shape.

15. A method for making spherical crystals comprising:
    a first process, wherein at least one thin projections made from semiconductor crystals are formed so that they project from a surface of a semiconductor crystal base;
    a second process, wherein a flow regulating film having a higher melting point than the melting point of said semiconductor of said projection is formed on said surface of said semiconductor crystal base;
    a third process, wherein a heating beam is applied to a tip of said projection to melt an entirety of said projection to form a molten portion; and
    a fourth process, wherein the application of said heating beam on said projection is halted, and said molten portion is solidified into a spherical crystal having a substantially spherical shape.

* * * * *